United States Patent [19]

Miniet

[11] Patent Number: 4,677,528
[45] Date of Patent: Jun. 30, 1987

[54] FLEXIBLE PRINTED CIRCUIT BOARD HAVING INTEGRATED CIRCUIT DIE OR THE LIKE AFFIXED THERETO

[75] Inventor: Jay J. Miniet, Ft. Lauderdale, Fla.

[73] Assignee: Motorola, Inc., Schaumburg, Ill.

[21] Appl. No.: 822,935

[22] Filed: Jan. 27, 1986

Related U.S. Application Data

[63] Continuation of Ser. No. 615,844, May 31, 1984, abandoned.

[51] Int. Cl.⁴ .............................................. H05K 1/18
[52] U.S. Cl. .................................... 361/398; 235/488; 235/492; 361/399; 361/401; 361/414
[58] Field of Search .............. 361/398, 401, 414, 394, 361/395, 399, 415, 395, 914; 235/488, 492

[56] References Cited

U.S. PATENT DOCUMENTS

| | | | |
|---|---|---|---|
| 3,474,297 | 10/1969 | Bylander | 361/398 |
| 3,622,419 | 11/1971 | London et al. | 156/242 |
| 3,670,639 | 6/1972 | Harnden, Jr. | 95/11 L |
| 3,780,352 | 12/1973 | Redwanz | 361/398 X |
| 3,832,769 | 9/1974 | Olyphant, Jr. et al. | 361/398 X |
| 3,875,478 | 4/1975 | Capstick | 361/398 X |
| 4,042,861 | 8/1977 | Yasuda et al. | 361/398 X |
| 4,064,552 | 12/1977 | Angelucci et al. | 361/401 X |
| 4,075,420 | 2/1978 | Walton | 361/398 X |
| 4,096,577 | 6/1978 | Ferber et al. | 361/398 X |
| 4,104,728 | 8/1978 | Kasubuchi | 361/398 X |
| 4,177,519 | 12/1979 | Kasubuchi et al. | 398 X/398 X |
| 4,213,041 | 7/1980 | Smith | 235/488 X |
| 4,261,042 | 4/1981 | Ishiwatari et al. | 361/398 X |
| 4,417,413 | 11/1983 | Hoppe et al. | 235/488 X |
| 4,463,971 | 8/1984 | Hoppe et al. | 235/488 X |
| 4,514,785 | 5/1986 | Parmentier | 174/52 FP X |
| 4,539,472 | 9/1985 | Poetker | 235/488 |
| 4,567,543 | 1/1986 | Miniet | 361/414 X |
| 4,587,413 | 5/1986 | Hoppe et al. | 235/492 |

*Primary Examiner*—R. R. Kucia
*Attorney, Agent, or Firm*—Martin J. McKinley; Daniel K. Nichols; Joseph T. Downey

[57] ABSTRACT

A flexible printed circuit board assembly having an integrated circuit die bonded directly thereto. A first layer of the flexible printed circuit board assembly includes a plurality of conductive paths and geometrical patterns on each of its surfaces. The conductive patterns include pads for mounting the integrated circuit die and connecting the wires from the integrated circuit. Additional intermediate layers of the flexible printed circuit board assembly, having an aggregate thickness greater than the height of the integrated circuit die and associated leads bonded thereto, surround the integrated circuit die. The top layer of the flexible printed circuit board provides for total encapsulation of the integrated circuit die for protection thereof. In the preferred embodiment that portion of the top layer which covers the integrated circuit die is opaque to prevent the passage of ultraviolet light which might otherwise cause damage to the integrated circuit.

3 Claims, 2 Drawing Figures

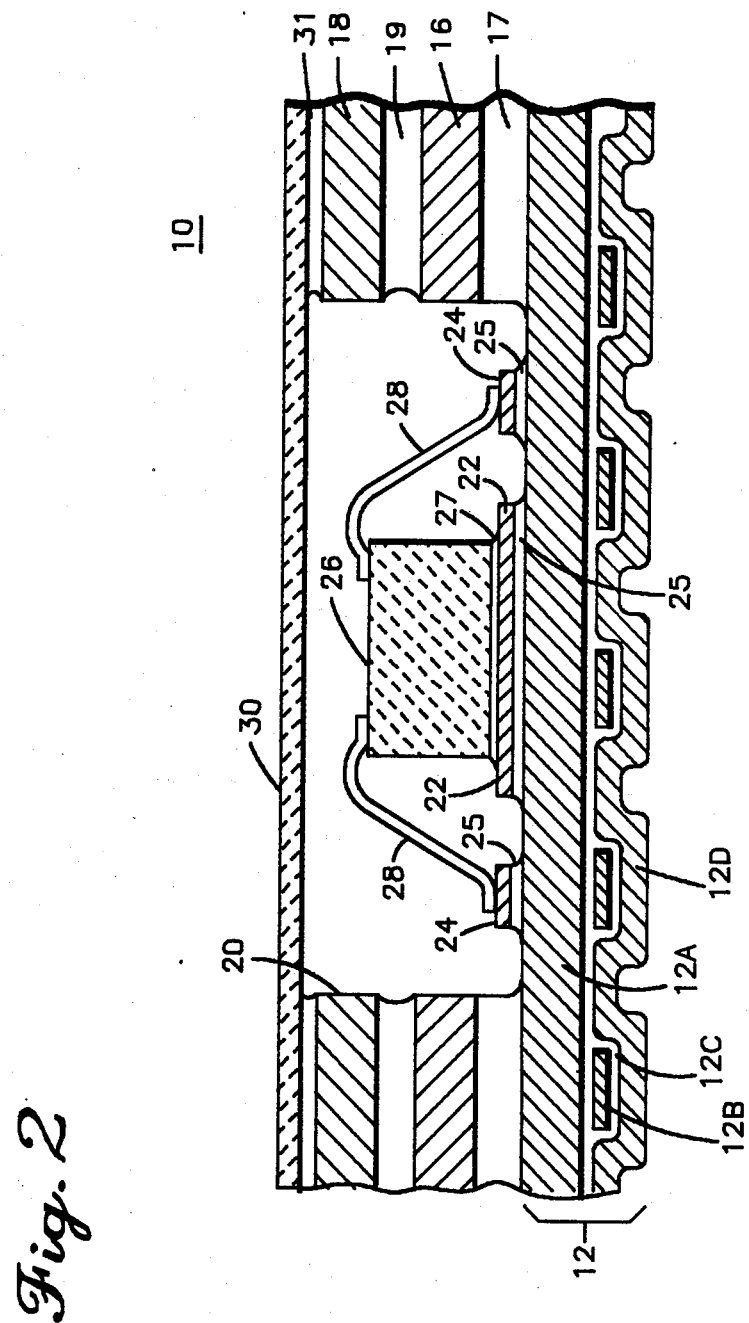

FLEXIBLE PRINTED CIRCUIT BOARD HAVING INTEGRATED CIRCUIT DIE OR THE LIKE AFFIXED THERETO

This is a continuation of application Ser. No. 615,844, filed May 31, 1984 now abandoned.

BACKGROUND OF THE INVENTION

1. Field of the Invention

The present invention relates to flexible circuit boards and more particularly to a flexible circuit board having an integrated circuit die encapsulated therein and affixed thereto.

2. Description of the Prior Art

In the past, flexible electronic circuit boards have been designed for high component density constructions which provide for both the use of leadless and leaded components affixed thereto. However, the aforesaid flexible electronic circuit boards do not possess the required rigidity in order to mount a chip carrier or other similar package directly thereon. Therefore, the flexible circuit board normally has a rigid conventional circuit board portion attached thereto for receiving the leads of a chip carrier thereto in order to provide the necessary stability for the bulky chip carrier or similar package.

Furthermore, the use of a chip carrier or other package to hold the integrated circuit die mandates the provision of a large surface area on the flexible printed circuit board and thus inhibits further miniaturization of the flexible printed circuit boards and or the ability to fit more circuit components on the same sized flexible printed circuit board.

SUMMARY OF THE INVENTION

Accordingly, one object of this invention is to provide a flexible printed circuit board which includes an integrated circuit die affixed thereto.

Another object of the present invention is to provide a flexible printed circuit board which includes an integrated circuit die affixed thereto which can be readily and easily manufactured at a lower cost.

Yet another object of the present invention is to provide a flexible printed circuit board which facilitates the easy replacement of an integrated circuit die resulting in enhanced repairability of the flexible printed circuit board and reduced cost of repair.

Still another object of the present invention is to provide a flexible printed circuit board having an integrated circuit die affixed thereto which eliminates the use of a chip carrier or similar package and enables a reduction in the size of the flexible printed circuit board or an increase in the number of components carried by the same size flexible printed circuit board.

In order to accomplish the above-mentioned objects a flexible printed circuit board having an integrated circuit die affixed directly thereto is provided. The first layer of the flexible printed circuit board includes a plurality of conductor paths and patterns on each of its surfaces. The conductor patterns include pads for mounting the integrated circuit die and for connecting the wires from the integrated circuit to the conductive paths. Additional intermediate layers of the flexible printed circuit board, their aggregate thickness being greater than the height of the integrated circuit die and associated wire, surround the integrated circit die. Each of the intermediate layers has an appropriately sized opening in alignment with the openings in the other intermediate layers so that a recess is joined to receive the integrated circuit die. The top layer of the flexible printed circuit board closes the recess and provides for total encapsulation of the integrated circuit die for protection thereof.

The flexible printed circuit board having the integrated circuit die affixed directly thereto is manufactured by starting with a basic layer of flexible material with copper adhered to both sides thereof. Conventional photo-imaging and etching techniques are used to produce the desired printed geometrical circuit patterns and connecting pads. The integrated circuit die is then adhesively bonded to its appropriate pad and the electrical connections made by ultrasonic wire bonding. Once the integrated circuit is in place, in the preferred embodiment additional intermediate layers of flexible material are built up from the surface of the first layer, each of the layers being bonded to the layer below it. Each of the additional intermediate layers includes an opening which aligns with the other openings and forms a recess such that the intermediate layers may surround the integrated circuit die. It should be noted that the aggregate height of the intermediate layers must be greater than the height of the integrated circuit die and associated wire. Finally, a top layer of the flexible material is bonded to the top intermediate layer which provides for total encapsulation of the integrated circuit die for protection thereof.

BRIEF DESCRIPTION OF THE DRAWINGS

A more complete appreciation of the invention and many of the attendant advantages thereof will be readily obtained as the same becomes better understood by reference to the following detailed description when considered in conection with the accompanying drawings, wherein:

FIG. 2 is a partial cross-sectional view of the present invention taken along the line II—II.

DESCRIPTION OF THE PREFERRED EMBODIMENTS

Figure 1:
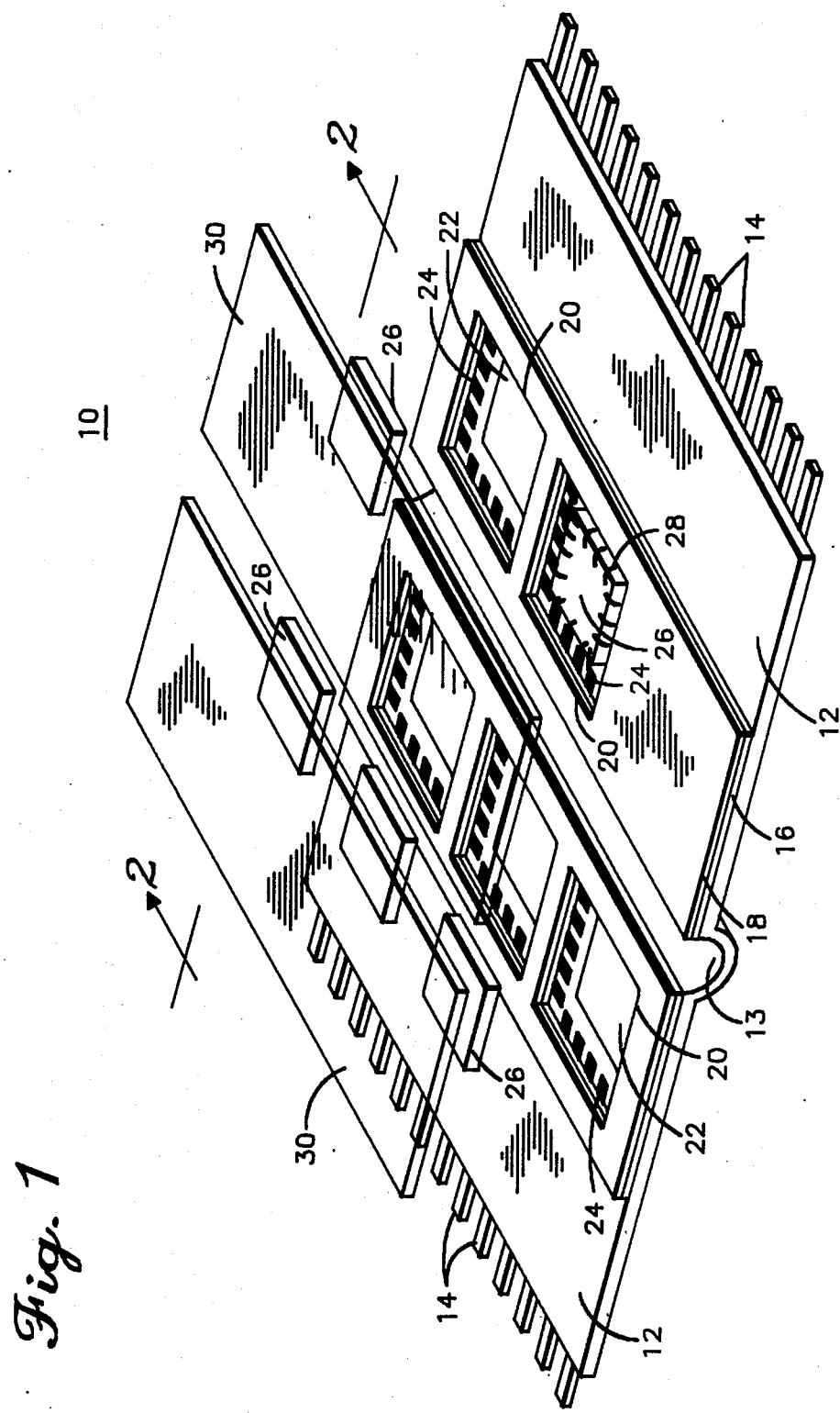
FIG. 1 is an exploded perspective view of the present invention.

Referring now to the drawings, wherein like reference numerals designate identical or corresponding parts throughout the several views, and more particularly to FIG. 1 thereof, an exploded perspective view of the present invention is illustrated. The flexible printed circuit board assembly 10 of the present invention includes the first layer 12 which contains the flexible printed circuit (not shown) which is connected to the plurality of conductive contacts 14 protruding from both ends thereof. The flexible layer 12 is pliable enough to allow the flexible circuit to be folded prior to being inserted into a suitable protective housing. Additional flexible layers 16 and 18 are built up from the flexible layer 12 and have appropriate aligned openings therein in order to form the recessed areas or windows 20 which expose the mounting pad 22 and the conductor pads 24 which are connected to the appropriate conductors in the printed circuit patterns. The recessed areas 20 are sized to receive the integrated circuit die 26 therein and thus the depth of each recessed area 20 is designed to be deeper than the combined thickness of the integrated circuit die 26 and attached leads 28. The leads 28 from the integrated circuit residing on the integrated circit die 26 are bonded to the conductive pads 24. Finally, a protective flexible cover coat 30 is bonded to the flexible layer 18 in order to fully cover the integrated circuit die and protect it from the outside environment.

Referring now to FIG. 2 a cross-section of the flexible printed circuit board assembly 10 having an integrated circuit affixed directly thereto is illustrated. The flexible printed circuit board assembly 10 includes a first flexible layer 12 having the respective conductive path 12b adhered to the bottom surface of flexible material 12a by way of the acrylic adhesive 12c and the respective conductive pads 22 and 24 adhered to the top side of flexible material 12a by way of an acrylic adhesive layer 25. It should be noted that the flexible material 12a is originally sandwiched between two layers of annealed copper and that conventional photo image printing and etching techniques are utilized to produce the desired conductive geometrical patterns and pads shown in the drawing. It should be further understood that the conductors 12b may be cover coated with another flexible layer 12d, which is adhesively bonded to flexible material 12a to provide protection therefor.

The conductive pads 22 and 24 are preferably coated with a 30 millionths inch layer of nickel and a 10 millionth inch layer of gold to enhance their conductivity characteristics and rigidity. The flexible circuit assembly board 10 further comprises the integrated circuit die 26 which is first affixed to the pad 22 by way of an epoxy adhesive layer 27. The leads 28 are ultrasonically bonded to appropriate pads on the integrated circuit residing on the integrated circuit die 26 and to respective the conductive pads 24. The flexible circuit board 10 further comprises the flexible layer 16 which is adhered to the flexible layer 12 by way of the layer 17 of any acrylic adhesive. Similarly, the layer 18 is bonded to the flexible layer 16 by way of the acrylic adhese layer 19. Each of the layers 16 and 18 has an opening therein which align with the opening in the other layer to form a recess or pocket 20 to receive the integrated circuit die 26. As can be seen, the height of the layers 16 through 18 are higher than the height of the uppermost portions of the integrated circuit leads 28.

Finally, the flexible layer 30 is added by being adhesively bonded to the layer 18 with the acrylic adhesive layer 31. The addition of the flexible layer 30 provides for total encapsulation of the integrated circuit die 26 to protect it from the outside environment.

In the preferred embodiment, the flexible layers 12a, 12d, 16, 18 and 30 are made of the polyimide film type F. The flexible layer 30 is of an opaque color in order to prevent the introduction of ultraviolet light into the pocket space 20 which contains the integrated circuit die 26 to prevent damage to the integrated circuit thereon.

Obviously, numerous (additional) modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A flexible circuit board assembly, suitable for insertion into a protective housing, said flexible circuit board assembly comprising in combination:
   a first flexible layer having a printed circuit geometrical pattern;
   first and second integrated circuit dies bonded respectively to first and second areas of said first flexible layer, said dies being electrically connected to said printed circuit pattern;
   first and second intermediate layers each having an opening for respectively receiving said first and second dies, each of said intermediate layers having first and second surfaces wherein each of said first surfaces is bonded to said first flexible layer and each of said second surfaces respectively extends beyond said first and second dies, said first and second intermediate layers being separated by a gap; and
   first and second cover layers respectively bonded to said second surface of said first and second intermediate layers, thereby encapsulating said first and second dies;
   whereby said assembly can be folded along said gap and inserted into said protective cover.

2. The flexible circuit board assembly, according to claim 1, wherein one of said cover layers includes a sheet of opaque polyimide film, thereby protecting one of said integrated circuit die from ultra-violet light.

3. The flexible circuit board assembly of claim 1, wherein each intermediate layer includes a plurality of sheets of polyimide film bonded to one another.

* * * * *

UNITED STATES PATENT AND TRADEMARK OFFICE
CERTIFICATE OF CORRECTION

PATENT NO. : 4,677,528

DATED : June 30, 1987

INVENTOR(S) : Jay J. Miniet

It is certified that error appears in the above-identified patent and that said Letters Patent is hereby corrected as shown below:

The term of this patent subsequent to January 28, 2003 has been disclaimed.

Signed and Sealed this

Ninth Day of February, 1988

*Attest:*

DONALD J. QUIGG

*Attesting Officer*      *Commissioner of Patents and Trademarks*